United States Patent
Bernds et al.

(10) Patent No.: US 7,229,868 B2
(45) Date of Patent: *Jun. 12, 2007

(54) ORGANIC FIELD-EFFECT TRANSISTOR, METHOD FOR STRUCTURING AN OFET AND INTEGRATED CIRCUIT

(75) Inventors: Adolf Bernds, Baiersdorf (DE); Wolfgang Clemens, Puschendorf (DE); Peter Haring, Raeren (BE); Heinrich Kurz, Aachen (DE); Borislav Vratzov, Aachen (DE)

(73) Assignee: PolyIC GmbH & Co. KG, Furth (DE)

( * ) Notice: Subject to any disclaimer, the term of this patent is extended or adjusted under 35 U.S.C. 154(b) by 170 days.

This patent is subject to a terminal disclaimer.

(21) Appl. No.: 10/433,959

(22) PCT Filed: Dec. 7, 2001

(86) PCT No.: PCT/DE01/04611

§ 371 (c)(1),
(2), (4) Date: Nov. 17, 2003

(87) PCT Pub. No.: WO02/47183

PCT Pub. Date: Jun. 13, 2002

(65) Prior Publication Data

US 2004/0063267 A1 Apr. 1, 2004

(30) Foreign Application Priority Data

Dec. 8, 2000 (DE) ................. 100 61 297

(51) Int. Cl.
*H01L 21/336* (2006.01)

(52) U.S. Cl. .............. 438/197; 438/82; 438/99; 438/780; 257/213; 257/288; 257/401; 257/E51.005

(58) Field of Classification Search ............ 438/197, 438/99, 82, 780; 257/401, 288, E51.005
See application file for complete search history.

(56) References Cited

U.S. PATENT DOCUMENTS 3,512,052 A   5/1970  MacIver et al.
3,769,096 A  10/1973  Ashkin (Continued)

FOREIGN PATENT DOCUMENTS

DE          33 38 597        5/1985

(Continued)

OTHER PUBLICATIONS

Garnier F et al:, "Vertical Devices Architecture By Molding Of Organic-Based Thin Film Transistor", Applied Physics Letters, American Institute Of Physics, XP000784120, issn: 0003-6951 abbildung 2.

(Continued)

*Primary Examiner*—Thao P. Le
(74) *Attorney, Agent, or Firm*—CarellaByrne et al.; Elliot M. Olstein; William Squire

(57) ABSTRACT

The invention relates to an organic field-effect transistor, to a method for structuring an OFET and to an integrated circuit with improved structuring of the functional polymer layers. The improved structuring is obtained by introducing, using a doctor blade, the functional polymer in the mold layer in which recesses are initially produced by imprinting.

7 Claims, 2 Drawing Sheets

U.S. PATENT DOCUMENTS

| | | | |
|---|---|---|---|
| 3,955,098 A | 5/1976 | Kawamoto | |
| 4,302,648 A | 11/1981 | Sado et al. | |
| 4,340,657 A | 7/1982 | Rowe | |
| 4,442,019 A | 4/1984 | Marks | |
| 4,865,197 A | 9/1989 | Craig | |
| 4,926,052 A | 5/1990 | Hatayama | |
| 4,937,119 A | 6/1990 | Nickles et al. | |
| 5,173,835 A | 12/1992 | Cornett et al. | |
| 5,206,525 A | 4/1993 | Yamamoto et al. | |
| 5,219,462 A * | 6/1993 | Bruxvoort et al. | 51/293 |
| 5,259,926 A | 11/1993 | Kuwabara et al. | |
| 5,321,240 A | 6/1994 | Takahira | |
| 5,347,144 A | 9/1994 | Garnier et al. | |
| 5,364,735 A | 11/1994 | Akamatsu et al. | |
| 5,395,504 A | 3/1995 | Hoffman et al. | |
| 5,480,839 A | 1/1996 | Ezawa et al. | |
| 5,486,851 A | 1/1996 | Gehner et al. | |
| 5,487,897 A * | 1/1996 | Polson et al. | 424/426 |
| 5,502,396 A | 3/1996 | Desarzens | |
| 5,546,889 A | 8/1996 | Wakita et al. | |
| 5,569,879 A | 10/1996 | Gloton et al. | |
| 5,574,291 A | 11/1996 | Dodabalapur et al. | |
| 5,578,513 A | 11/1996 | Maegawa | |
| 5,580,794 A | 12/1996 | Allen | |
| 5,625,199 A | 4/1997 | Baumbach et al. | |
| 5,630,986 A | 5/1997 | Miller et al. | |
| 5,652,645 A | 7/1997 | Jain | |
| 5,691,089 A | 11/1997 | Smayling | |
| 5,705,826 A | 1/1998 | Aratani et al. | |
| 5,729,428 A | 3/1998 | Sakata et al. | |
| 5,854,139 A | 12/1998 | Konda et al. | |
| 5,869,972 A | 2/1999 | Birch et al. | |
| 5,883,397 A | 3/1999 | Isoda et al. | |
| 5,892,244 A | 4/1999 | Tanaka et al. | |
| 5,967,048 A | 10/1999 | Fromson et al. | |
| 5,970,318 A | 10/1999 | Choi et al. | |
| 5,973,598 A | 10/1999 | Beigel | |
| 5,994,773 A | 11/1999 | Hirakawa | |
| 5,997,817 A | 12/1999 | Crismore et al. | |
| 5,998,805 A | 12/1999 | Shi et al. | |
| 6,036,919 A | 3/2000 | Thym et al. | |
| 6,045,977 A | 4/2000 | Chandross et al. | |
| 6,072,716 A | 6/2000 | Jacobson et al. | |
| 6,083,104 A | 7/2000 | Choi | |
| 6,087,196 A | 7/2000 | Sturm et al. | |
| 6,133,835 A | 10/2000 | De Leeuw et al. | |
| 6,150,668 A | 11/2000 | Bao et al. | |
| 6,197,663 B1 * | 3/2001 | Chandross et al. | 438/455 |
| 6,207,472 B1 | 3/2001 | Callegari et al. | |
| 6,215,130 B1 | 4/2001 | Dodabalapur | |
| 6,221,553 B1 | 4/2001 | Wolk et al. | |
| 6,251,513 B1 | 6/2001 | Hyatt | |
| 6,272,275 B1 * | 8/2001 | Cortright et al. | 385/129 |
| 6,284,562 B1 | 9/2001 | Batlogg et al. | |
| 6,300,141 B1 | 10/2001 | Segal et al. | |
| 6,321,571 B1 * | 11/2001 | Themont et al. | 65/155 |
| 6,322,736 B1 * | 11/2001 | Bao et al. | 264/105 |
| 6,329,226 B1 | 12/2001 | Jones et al. | |
| 6,330,464 B1 | 12/2001 | Colvin et al. | |
| 6,335,539 B1 | 1/2002 | Dimitrakopoulos et al. | |
| 6,340,822 B1 | 1/2002 | Brown et al. | |
| 6,344,662 B1 | 2/2002 | Dimitrakopoulos et al. | |
| 6,362,509 B1 | 3/2002 | Hart | |
| 6,384,804 B1 | 5/2002 | Dodabalapur et al. | |
| 6,403,396 B1 | 6/2002 | Gudesen et al. | |
| 6,429,450 B1 | 8/2002 | DeLeeuw et al. | |
| 6,498,114 B1 | 12/2002 | Amundson et al. | |
| 6,517,995 B1 * | 2/2003 | Jacobson et al. | 430/320 |
| 6,555,840 B1 * | 4/2003 | Hudson et al. | 257/40 |
| 6,593,690 B1 | 7/2003 | McCormick et al. | |
| 6,603,139 B1 | 8/2003 | Tessler et al. | |
| 6,621,098 B1 | 9/2003 | Jackson et al. | |
| 6,646,662 B1 * | 11/2003 | Nebashi et al. | 346/140.1 |
| 6,852,583 B2 * | 2/2005 | Bernds et al. | 438/197 |
| 6,960,489 B2 * | 11/2005 | Bernds et al. | 438/99 |
| 2002/0018911 A1 | 2/2002 | Bemius et al. | |
| 2002/0022284 A1 | 2/2002 | Heeger et al. | |
| 2002/0025391 A1 | 2/2002 | Angelopoulos | |
| 2002/0053320 A1 | 5/2002 | Duthaler | |
| 2002/0056839 A1 | 5/2002 | Joo et al. | |
| 2002/0068392 A1 | 6/2002 | Lee et al. | |
| 2002/0130042 A1 | 9/2002 | Stiene | |
| 2002/0170897 A1 | 11/2002 | Hall | |
| 2002/0195644 A1 | 12/2002 | Dodabalapur et al. | |
| 2003/0059987 A1 | 3/2003 | Sirringhaus Henning et al. | |
| 2003/0112576 A1 | 6/2003 | Brewer et al. | |
| 2003/0175427 A1 * | 9/2003 | Loo et al. | 427/256 |
| 2004/0002176 A1 | 1/2004 | Xu | |
| 2004/0013982 A1 * | 1/2004 | Jacobson et al. | 430/320 |
| 2004/0026689 A1 | 2/2004 | Bernds et al. | |
| 2004/0084670 A1 | 5/2004 | Tripsas et al. | |
| 2004/0211329 A1 * | 10/2004 | Funahata et al. | 101/463.1 |

FOREIGN PATENT DOCUMENTS

| | | |
|---|---|---|
| DE | 4243832 | 6/1994 |
| DE | 198 52312 | 5/1999 |
| DE | 198 16 860 | 11/1999 |
| DE | 19918193 | 11/1999 |
| DE | 198 51 703 | 5/2000 |
| DE | 198 51 703 A1 | 5/2000 |
| DE | 198 51703 | 5/2000 |
| DE | 100 06257 | 9/2000 |
| DE | 199 21024 | 11/2000 |
| DE | 19933757 | 1/2001 |
| DE | 69519782 | 1/2001 |
| DE | 199 35 527 | 2/2001 |
| DE | 19935527 | 2/2001 |
| DE | 199 37 262 | 3/2001 |
| DE | 19937262 | 3/2001 |
| DE | 100 12204 | 9/2001 |
| DE | 100 33112 | 1/2002 |
| DE | 10033112 | 1/2002 |
| DE | 100 43 204 A1 | 4/2002 |
| DE | 100 45 192 | 4/2002 |
| DE | 100 47 171 | 4/2002 |
| DE | 100 43204 | 4/2002 |
| DE | 100 58 559 | 5/2002 |
| DE | 100 61297 | 6/2002 |
| DE | 10061297 | 6/2002 |
| DE | 101 17 663 A1 | 10/2002 |
| DE | 101 20 687 | 10/2002 |
| DE | 102 19905 | 12/2003 |
| EP | 0 108650 | 5/1984 |
| EP | 0 128 529 | 12/1984 |
| EP | 0 268 370 A2 | 5/1988 |
| EP | 0 268 370 A3 | 5/1988 |
| EP | 0 350 179 | 1/1990 |
| EP | 0 418504 | 3/1991 |
| EP | 0 442 123 A1 | 8/1991 |
| EP | 0 442123 | 8/1991 |
| EP | 0460242 | 12/1991 |
| EP | 0501456 A2 | 9/1992 |
| EP | 0501456 A3 | 9/1992 |
| EP | 0 511807 | 11/1992 |
| EP | 0 528662 | 2/1993 |
| EP | 0 528662 | 2/1994 |
| EP | 0685985 | 12/1995 |
| EP | 0716458 | 6/1996 |
| EP | 0 785 578 A2 | 7/1997 |
| EP | 0 785 578 A3 | 7/1997 |
| EP | 0 786820 | 7/1997 |
| EP | 0 615 256 B1 | 9/1998 |
| EP | 0 962 984 | 12/1999 |

| | | |
|---|---|---|
| EP | 0 962 984 A2 | 12/1999 |
| EP | 0962984 | 12/1999 |
| EP | 0966182 | 12/1999 |
| EP | 0 979715 | 2/2000 |
| EP | 0981165 | 2/2000 |
| EP | 0989614 A2 | 3/2000 |
| EP | 1 048 912 | 11/2000 |
| EP | 1 052 594 | 11/2000 |
| EP | 1065725 A2 | 1/2001 |
| EP | 1065725 A3 | 1/2001 |
| EP | 1 083 775 A1 | 3/2001 |
| EP | 1 102 335 A2 | 5/2001 |
| EP | 1 104 035 A2 | 5/2001 |
| EP | 1 103916 | 5/2001 |
| EP | 1 134 694 | 9/2001 |
| EP | 1 224 999 | 7/2002 |
| EP | 1224999 | 7/2002 |
| EP | 1237207 | 9/2002 |
| EP | 1 318 084 | 6/2003 |
| FR | 2793089 | 11/2000 |
| GB | 723598 | 2/1955 |
| GB | 2 058 462 | 4/1981 |
| JP | 54069392 | 6/1979 |
| JP | 61167854 | 7/1986 |
| JP | 62-65477 | 3/1987 |
| JP | 362065477 A | 3/1987 |
| JP | 01169942 | 7/1989 |
| JP | 05152560 | 6/1993 |
| JP | 05259434 | 10/1993 |
| JP | 05347422 | 12/1993 |
| JP | 08197788 | 8/1996 |
| JP | 09083040 | 3/1997 |
| JP | 09320760 A | 12/1997 |
| JP | 10026934 | 1/1998 |
| JP | 2969184 B | 11/1999 |
| JP | 2001085272 | 3/2001 |
| WO | WO 93 16491 | 8/1993 |
| WO | WO 94/17556 | 8/1994 |
| WO | WO 95/06240 | 3/1995 |
| WO | WO 95/31831 | 11/1995 |
| WO | WO 96 02924 | 2/1996 |
| WO | WO 96/19792 | 6/1996 |
| WO | WO 97/12349 | 4/1997 |
| WO | WO 97/18944 | 5/1997 |
| WO | WO 09718944 | 5/1997 |
| WO | WO 98 18156 | 4/1998 |
| WO | WO 98 18158 | 4/1998 |
| WO | WO9818186 | 4/1998 |
| WO | WO 98/40930 | 9/1998 |
| WO | WO 99/07189 | 2/1999 |
| WO | 99/10939 | 3/1999 |
| WO | WO 99 10929 | 3/1999 |
| WO | WO 99/10929 | 3/1999 |
| WO | WO 99 10939 | 3/1999 |
| WO | WO 99 21233 | 4/1999 |
| WO | WO 99 30432 | 6/1999 |
| WO | WO 9930432 | 6/1999 |
| WO | WO 99 39373 | 8/1999 |
| WO | WO 99 40631 | 8/1999 |
| WO | WO 99/53371 | 10/1999 |
| WO | WO 99 54936 | 10/1999 |
| WO | WO 9954936 | 10/1999 |
| WO | WO 99/66540 | 12/1999 |
| WO | WO 00/33063 | 6/2000 |
| WO | WO 00/36666 | 6/2000 |
| WO | 00/79617 A1 | 12/2000 |
| WO | WO 00 79617 | 12/2000 |
| WO | WO 01/03126 | 1/2001 |
| WO | WO 01/06442 | 1/2001 |
| WO | WO 0108241 | 2/2001 |
| WO | WO 01/15233 | 3/2001 |
| WO | WO 01 15233 | 3/2001 |
| WO | WO 01/17029 | 3/2001 |
| WO | WO 01 17041 | 3/2001 |
| WO | WO 01/17041 | 3/2001 |
| WO | WO 01/24998 | 4/2001 |
| WO | WO 01/27998 | 4/2001 |
| WO | WO 01/46987 | 6/2001 |
| WO | WO 01 47045 | 6/2001 |
| WO | WO 0147044 A2 | 6/2001 |
| WO | WO 0147044 A3 | 6/2001 |
| WO | WO 0173109 A2 | 10/2001 |
| WO | WO 0173109 A3 | 10/2001 |
| WO | WO 02/05360 | 1/2002 |
| WO | WO 0205361 | 1/2002 |
| WO | WO 02/15264 | 2/2002 |
| WO | 02/19443 A1 | 3/2002 |
| WO | WO 02 19443 | 3/2002 |
| WO | WO 02/29912 | 4/2002 |
| WO | WO 02/43071 | 5/2002 |
| WO | WO 02/47183 | 6/2002 |
| WO | WO 0247183 | 6/2002 |
| WO | WO 02/065557 | 8/2002 |
| WO | WO 02/071139 | 9/2002 |
| WO | WO 02/071505 | 9/2002 |
| WO | WO 02/076924 | 10/2002 |
| WO | WO 02/091495 | 11/2002 |
| WO | WO 02095805 A2 | 11/2002 |
| WO | WO 02095805 A3 | 11/2002 |
| WO | WO 02/099908 | 12/2002 |
| WO | WO 0299907 | 12/2002 |
| WO | WO 03/046922 | 6/2003 |
| WO | WO 03/069675 | 8/2003 |
| WO | WO 03067680 | 8/2003 |
| WO | WO 03/081671 | 10/2003 |
| WO | WO 03/095175 | 11/2003 |
| WO | WO 2004/032257 | 4/2004 |
| WO | WO 2004/042837 | 5/2004 |
| WO | WO 2004042837 | 5/2004 |
| WO | WO 200407194 A2 | 6/2004 |
| WO | WO 200407194 A3 | 6/2004 |
| WO | WO 2004047144 A2 | 6/2004 |
| WO | WO 2004047144 A3 | 6/2004 |
| WO | WO 2004/083859 | 9/2004 |
| WO | WO 00 79617 | 12/2004 |

OTHER PUBLICATIONS

Collet J. et al:, Low Voltage, 30 NM Channel Length, Organic Transistors With a Self-Assembled Monolayer as Gate Insulating Films:, Applied Physics Letters, American Institute of Physics. New York, US, Bd 76, Nr. 14, Apr. 3, 2000, Selten 1941-1943, XP000950589, ISSN:0003-6951, das ganze Dokument.

Hwang J D et al:, "A Vertical Submicron Sic thin film transistor", Solid State Electronics, Elsevier Science Publishers, Barking, GB, Bd. 38, NR. 2, Feb. 1, 1995, Seiten 275-278, XP004014040, ISSN:0038-1101, Abbildung 2.

Rogers J A et al:, "Low-Voltage 0.1 Mum Organic Transistors and Complementary Inverter Circuits Fabricated with a Low-Cost Form of Near-Field Photolithography", Applied Physics Letters, American Institute of Physics. New York, US, Bd. 75, Nr. 7, Aug. 16, 1999, Seiten 1010-1012, XP000934355, ISSN: 003-6951, das ganze Dokument.

"Short-Channel Field-Effect Transistor", IBM Technical Disclosure Bulletin, IBM Corp., New York, US, Bd. 32, Nr. 3A, Aug. 1, 1989, Seiten 77-78, XP000049357, ISSN:0018-8689, das ganze Dokument.

Redecker, M. et al., "Mobility enhancement through homogeneous nematic alignment of a liquid-crystalline polyfluorene", 1999 American Institute of Physics, Applied Physics Letters, vol. 74, No. 10, pp. 1400-1402.

Rogers, J. A. et al:, "Printing Process Suitable for Reel-to-Reel Production of High-Performance Organic Transistors and Circuits", Advanced Materials, VCH, Verlagsgesellschaft, Weinheim, DE, Bd. 11. Nr. 9, Jul. 5, 1999, Seiten 741-745, P000851834, ISSN: 0935-9648, das ganze Dokument.

Miyamoto, Shoichi et al:, Effect of LDD Structure and Channel Poly-Si Thinning on a Gate-All-Around TFT (GAT) for SRAM's, IEEE Transactions on Electron Devices. vol. 46, No. 8, Aug. 1999.

Kumar, Anish et al:, "Kink-Free Polycrystalline Silicon Double-Gate Elevated-Channel Thin-Film Transistors", IEEE Transactions on Electron Devices, vol. 45, No. 12, Dec. 1998.

Chen, Shiao-Shien et al:, "Deep Submicrometer Double-Gate Fully-Depleted SOI PMOS Devices: A Concise Short-Channel Effect Threshold Voltage Model Using a Quasi-2D Approadh", IEEE Transaction on Electron Devices, vol. 43, No. 9, Sep. 1996.

Zangara L: "Metall Statt Halbleiter, Programmierung Von Embedded ROMS Ueber Die Metallisierungen", Elektronik, Franzis Verlag GMBH, Munchen, DE, Bd. 47, Nr. 16, Aug. 4, 1998, Seiten 52-55, XP000847917, ISSN: 0013-5658, Seite 52, rechtes Plate, Zeile 7-Seite 53, Iinke Spalte, Zeile 14; Abbildungen 1, 2.

Hergel, H. J.: "Pld-Programmiertechnologien", Elektronik, Franzis Verlag GMBH. Munchen, DE, Bd 41, Nr. 5, Mar. 3, 2003, Seiten 44-46, XP000293121, ISSN: 0013-5658, Abbildungen 1-3.

Forrest et al.: "The Dawn of Organic Electronics", IEEE Spectrum, Aug. 2000, Seiten 29-34, XP002189000, IEEE Inc., New York, US ISSN:0018-9235, Seite 33, rechte Spalte, Zelle 58-Seite 34, Iinke Spalte, Zeile 24; Abbildung 5.

Patent Abstracts of Japan, vol. 009, No. 274 (E-354), Oct. 31, 1985 & JP 60 117769 A (Fujitsu KK), Jun. 25, 1985 Zusammenfassung.

Zie Voor Titel Boek, de 2e Pagina, XP-002189001, p. 196-228.

Drury et al., "Low-Cost All-Polymer Integrated Circuits", American Institute of Physics, Applied Physics Letters, 1998, vol. 73, No. 1, pp. 108-110, Jul. 6, 1998.

Kuhlmann et al., "Terabytes in Plastikfolie", Organische Massenspeicher vor der Serienproduktion.

Garnier, F. et al, "All-Polymer Field-Effect Transistor Realized by Printing Techniques", Science, American Association for the Advancement of Science, US, vol. 265, Sep. 16, 1994, pp. 1684-1686.

Assadi A, et al:, Field-Effect Mobility of Poly (3-Hexylthiophene) Dept. of Physics and Measurement Technology, Received Mar. 3, 1988; accepted for Publication May 17, 1988.

Bao, Z. et al., "High-Performance Plastic Transistors Fabricatecd by Printing Techniques", Chem. Mater vol. 9, No. 6, 1997, pp. 1299-1301.

Drury, C. J. et al., "Low-cost all-polymer integrated circuits", Applied Physics Letters, vol. 73, No. 1, Jul. 6, 1988, pp. 108-110.

Angelopoulos M et al, "In-Situ Radiation Induced Doping", Mol. Cryst. Liq. Cryst. 1990, vol. 189, pp. 221-225.

Dai, L. et al, Photochemical Generation of Conducting Pattersn in Polybutadiene Films:, Macromolecules, vol. 29, No. 1, 1996, pp. 282-287, XP 001042019, the whole document.

Roman et al., Polymer Diodes With High Rectification:, Applied Physics Letters, vol. 75, No. 21, Nov. 22, 1999.

Patent Abstracts of Japan, vol. 010, No. 137, May 21, 1986 (JP 361001060A).

Schoebel, "Frequency Conversion with Organic-On-Inorganic Heterostructured Diodes", Extended Abstracts of the International Conference on Solid State Devices and Materials, Sep. 1, 1997.

Braun D., et al, "Visible light emission from semiconducting polymer diodes", American Institute of Physics, Applied Physics Letters 58, May 6, 1991, pp. 1982-1984.

Yu, G. et al., "Dual-function semiconducting polymer devices: Light-emitting and photodetecting diodes", American Institute of Physics, Applied Physics Letter 64, Mar. 21, 1994, pp. 1540-1542.

Lucent Technologies, "Innovation marks significant milestone in the development of electronic paper", Cambridge, MA and Muray Hill, NJ, Nov. 20, 2000. XP-002209726.

Hebner, T.R. et al., Ink-jet printing of doped polymers for organic light emitting devices:, American Institute of Physics, Applied Physics Letters, vol. 72, No. 5, Feb. 2, 1998, pp. 519-521.

Garnier et al., "Conjugated Polymers and Oligomers as Active Material For Electronic Devices", Synthetic Metals, vol. 28, 1989.

Gelinck, G.H. et al., "High-Performance All-Polymer Integrated Circuits", Applied Physics Letters, v. 77, 2000, pp. 1487-1489.

Zheng, Xiang-Yang et al., "Electrochemical Patterning of the Surface of Insulators with Electrically Conductive Polymers", J. Electrochem. Soc., v. 142, 1995, pp. L226-L227.

Lidzey, D. G. et al., "Photoprocessed and Micropatterned Conjugated Polymer LEDs", Synthetic Metals, V. 82, 1996, pp. 141-148.

Kobel W. et al., "Generation of Micropatterns in Poly (3-Methyl-Thiophene) Films Using Microlithography: A First Step in the Design of an All-Organic Thin-Film Transistor" Synthetic Metals, V. 22, 1988, pp. 265-271.

Rost, Henning et al., "All-Polymer Organic Field Effect Transistors", Proc. Mat. Week, CD, 2001, pp. 1-6.

Manuelli, Alessandro et al., "Applicability of Coating Techniques for the Production of Organic Field Effect Transistors", IEEE Polytronic 2002 Conference, 2002, pp. 201-204.

Ullman, A. et al., "High Performance Organic Field-Effect Transistors and Integrated Inverters", Mat. Res. Soc. Symp. Proc., v. 665, 2001, pp. 265-270.

Fix, W. et al., "Fast Polymer Integrated Circuits Based on a Polyfluorene Derivative", ESSDERC 2002, 2002, pp. 527-529.

Knobloch, A. et al., "Printed Polymer Transistors", Proc. Polytronic, v. 84, 2001, pp. 84-89.

Ficker, J. et al., "Dynamic and Lifetime Measurements of Polymer OFETS and Integrated Plastic Circuits," Proc. of SPIE, v. 466, 2001, pp. 95-102.

Clemens, W. et al., "Vom Organischen Transistor Zum Plastik-Chip," Physik Journal, V. 2, 2003, pp. 31-36.

Crone, B. et al, "Large-scale complementary Integrated circuits based on Organic transistors", Nature, vol. 403, Feb. 3, 2000, pp. 521-.

Fix, W., et al., "Fast polymer integrated circuits", American Institute of Physics, Applied Physics Letters, vol. 81, No. 89, Aug. 2002, pp. 1735-1737.

Dodabalapur, A. et al., Organic smart pixels, American Institute of Physics, Applied Physics Letters, vol. 73, No. 2, Jul. 13, 1998, pp. 142-144.

Halls, J.J. M., et al., "Efficient photodiodes from interpenetrating polymer networks", Nature, vol. 376, Aug. 10, 1995, pp. 498-500.

Brown, A.R. et al., "Field-effect transistors made from solution-processed organic semiconductors", Elsevier Science, S.A., Synthetic Metals 88 (1997) pp. 37-55.

Brown, A.R., "Logic Gates Made from Polymer Transistors and Their Use in Ring Oscillators", Science, vol. 270, Nov. 10, 1995, pp. 972-974.

Klauk, H. et al., "Pentacene Thin Film Transistors and Inverter Circuits", 1997 International Exectron Devices Meeting Technical Digest, pp. 539-542, Dec. 1997.

Klauk, H. et al., "Fast Organic Thin Film Transistor Circuits", IEEE Electron Device Letters, vol. 20, No. 6, pp. 289-291.

Bao, Z. et al., "Organic and Polymeric Materials for the Fabrications of Thin Film Field-Effect Transistors", paper presented at the meeting of American Chemical Society, Division of Polymer Chemistry, XX, XX, Bd. 39, Nr. 1, Mar. 29, 1998, P001032497, ISSN: 0032-3934 das ganze Dokument.

Patent Abstracts of Japan, vol. 013, No. 444 (E-828), Oct. 5, 1989 & JP 01 169942 A (Hitachi Ltd), Jul. 5, 1989.

John A. Rogers et al., "Printing Process Suitable for Reel-to-Reel Production of High-Performance Organic Transistors and Circuits," Advanced Materials, V. 11, 1999, pp. 741-745.

Fraunhofer Magazin, "Polytronic: Chips voon der Rolle", Nr. 4, 2001, pp. 8-13.

Oelkrug, D. et al., "Electronic spectra of self-organized oligothiophene films with 'standing' and 'lying' molecular units", Elsevier Science S.A., 1996, Thin Solid Films 284-270.

Sandberg, H. et al, "Ultra-thin Organic Films for Field Effect Transistors", SPIE vol. 4466, 2001, pp. 35-43.

Chen, X.L. et al., "Morphological and Transistor Studies of Organic Molecular Semiconductors with Anisotropic Electrical Characteristics", American Chemical Society, 2001, Chem. Mater. 2001, 13, 1341-1348.

De Leeuw D.M. et al., "Polymeric integrated circuits and light-emitting diodes", Electron Devices Meeting, 1997. Technical Digest, International, Washington, DC, USA Dec. 7-10, 1997, New York, NY, USA, IEEE, US Dec. 7, 1997.

Lowe, J. et al., "Poly (3—(2—Acetoxyethyl)Thiophene): A Model Polymer for Acid-Catalyzed Lithography", Snythetic Metals, Elsevier Sequoia, Lausanne, CH, Bd. 85, 1997, Seiten 1417-1430.

Schrodner M. et al., "Plastic electronics based on Semiconducting Polymers", First International IEEE Conference on Polymers and Adhesives in Microelectronics and Photonics. Incorporating Poly, Pep & Adhesives in Electronics. Proceedings (Cat. No. 01TH8592), First International IEEE Conference on Polymers and Adhesives in Micr, Seitenn 91-94

Harsanyi G. et al, "Polytronics for biogtronics:unique possibilities of polymers in biosensors and BioMEMS", IEEE Polytronic 2002 Conference, Jun. 23, 2002, pp. 211-215.

Koezuka, H. et al., "Macromolecular Electronic Device", Mol. Cryst. Liq. Cryst. 1994, vol. 2555, pp. 221-230.

U.S. Appl. No. 10/344,951, Adolf Bernds et al.
U.S. Appl. No. 10/362,932, filed Oct. 2, 2003, Adolf Bernds et al.
U.S. Appl. No. 10/380,113, filed Sep. 25, 2003, Adolf Bernds et al.
U.S. Appl. No. 10/380,206, Adolf Bernds et al.
U.S. Appl. No. 10/381,032, Adolf Bernds et al.
U.S. Appl. No. 10/433,959, Adolf Bernds.
U.S. Appl. No. 10/433,961, Wolfgang Clemens et al.
U.S. Appl. No. 10/451,108, Mark Giles et al.
U.S. Appl. No. 10/467,636, Adolf Bernds et al.
U.S. Appl. No. 10/473,050, Adolf Bernds et al.
U.S. Appl. No. 10/479,234, filed Dec. 30, 2004, Adolf Bernds et al.
U.S. Appl. No. 10/479,238, Adolf Bernds et al.
U.S. Appl. No. 10/492,922, Erwann Buillet et al.
U.S. Appl. No. 10/492,923, filed Dec. 23, 2004, Wolfgang Clemens et al.
U.S. Appl. No. 10/498,610, Walter Fix et al.
U.S. Appl. No. 10/508,640, Walter Fix et al.
U.S. Appl. No. 10/508,737, Adolf Bernds et al.
U.S. Appl. No. 10/517,750, Wolfgang Clemens et al.
U.S. Appl. No. 10/523,216, Adolf Bernds et al.
U.S. Appl. No. 10/523,487, Wolfgang Clemens et al.
U.S. Appl. No. 10/524,646, Walter Fix et al.
GR2001P03239.
GR2001P20024.
U.S. Appl. No. 10/541,815, Axel Gerit et al.
U.S. Appl. No. 10/541,956, Wolfgang Clemens et al.
U.S. Appl. No. 10/541,957, Walter Fix et al.
U.S. Appl. No. 10/533,756, Wolfgang Clemens et al.
U.S. Appl. No. 10/534,678, Wolfgang Clemens et al.
U.S. Appl. No. 10/535,448, Wolfgang Clemens et al.
U.S. Appl. No. 10/535,449, Adolf Bernds et al.
U.S. Appl. No. 10/344,926, Wolfgang Clemens et al.
U.S. Appl. No. 10/543,561, Wolfgang Clemens et al.
U.S. Appl. No. 10/542,678, Adolf Bernds et al.
U.S. Appl. No. 10/542,679, Adolf Bernds et al.

C.J. Drury et al., "Low-Cost All-Polymer Integrated Circuits," Applied Physics Letters, V. 73, 1998, pp. 108-110.

G.H. Gelinck et al., "High-Performance All-Polymer Integrated Circuits," Applied Physics Letters, V. 77, 2000, pp. 1487-1489.

Xiang-Yang Zheng et al., "Electrochemical Patterning of the Surface of Insulators with Electrically Conductive Polymers," J. Electrochem. Soc., V. 142, 1995, pp. L226-L227.

M. Angelopoulos et al., "In-Situ Radiation Induced Doping," Mol. Cryst. Liq. Cryst., V. 189, 1990, pp. 221-225.

J. Rogers et al., "Printing Process Suitable For Reel-To-Reel Production of High-Performance Organic Transistors and Circuits", Advanced Materials, VCH Verlagsgesellschaft, Weinheim, DE, vol. 11, No. 9, Jul. 5, 1999, pp. 741-745, XP000851834.

Brabec, C.J. et al, "Photoinduced FT-IR spectroscopy and CW-photocurrent measurements of conjugated polymers and fullerenes blended into a conventional polymer matrix", Solar Energy Materials and Solar Cells, 2000 Elsevier Science V.V., pp. 19-33.

Brabec, C.J. et al., "Photovoltaic properties of a conjugated polymer/methanofullerene composites embedded in a polystyrene matrix", Journal of Applied Physics, vol. 85, No. 9, 1999, pp. 6866-6872.

Gosain, D.P., "Excimer laser crystallized poly-Si TFT's on plastic substrates", Second International Symposium on Laser Precision Microfabrication, May 16-18, 2001, Singapore, vol. 4426, pp. 394-400.

Lu, Wen et al., "Use of Ionic Liquids for $\pi$-Conjugated Polymer Electrochemical Devices", Science, vol. 297, 2002, pp. 983-987/.

Shaheen, S.E., et al., "Low band-gap polymeric photovoltaic devices", Synthetic Metals, vol. 121, 2001, pp. 1583-1584.

Takashima, W. et al., Electroplasticity Memory Devices Using Conducting Polymers and Solid Polymer Electrolytes, Polymer International, Melbourne, 1992, pp. 249-253.

Velu, G. et al. "Low Driving Voltages and Memory Effect in Organic Thin-Film Transistors With A Ferroelectric Gate Insulator", Applied Physics Letters, American Institute of Physics, New York, vol. 79, No. 5, 2001, pp. 659-661.

Wang, Hsing et al., "Conducting Polymer Blends: Polythiophene and Polypyrrole Blends with Polystyrene and Poly(bisphenol A carbonate)", Macromolecules, 1990, vol. 23, pp. 1053-1059.

Wang, Yading et al., "Electrically Conductive Semiinterpenetrating Polymer Networks of Poly(3-octylthiophene)", Macromolecules 1992, vol. 25, pp. 3284-3290.

Dai, L. et al., "Conjugation of Polydienes by Oxidants Other Than Iodine", Elsevier Science S.A., Synthetic Metals 86 (1997) 1893-1894.

Dai, L. et al., "$I_2$-Doping of 1,4-Polydienes", Elsevier Science S.A., Synthetic Metals 69 (1995), pp. 563-566.

Kawase, T. et al., "Inkjet Printed Via-Hole Interconnections and Resistors for All-Polymer Transistor Circuits", Advanced Materials 2001, 13, No. 21, Nov. 2, 2001, pp. 1601-1605.

Qiao, X. et al., "The FeCI3-doped poly3-alkithiophenes) in solid state", Elsevier Science, Synthetic Metals 122 (2001) pp. 449-454.

* cited by examiner

ORGANIC FIELD-EFFECT TRANSISTOR, METHOD FOR STRUCTURING AN OFET AND INTEGRATED CIRCUIT

CROSS-REFERENCE TO RELATED APPLICATION

This application is a 371 of PCT/DE01/04611 filed Dec. 7, 2001 which claims the benefit of Germany Application No. 100 61 297.0, filed Dec. 8, 2000, the contents of which are hereby incorporated herein by reference in their entirety.

FIELD OF THE INVENTION

The invention relates to an organic field-effect transistor, to a method for patterning an OFET and to an integrated circuit with improved patterning of the functional polymer layers.

BACKGROUND OF THE INVENTION

Organic integrated circuits (integrated plastic circuits) based on organic field-effect transistors (OFETs) are used for high-volume microelectronics applications and disposable products such as identification and product "tags". A "tag" is, for example, an electronic bar code such as is applied to goods or suitcases. OFETs have a wide range of applications as RFID tags (radio frequency identification tags) which do not necessarily have to be attached only on the surface. With OFETs for these applications, there is no requirement for the excellent operating characteristics offered by silicon technology; on the other hand there should be a guarantee of low manufacturing costs and mechanical flexibility. The components such as electronic bar codes are typically single-use products and are only of interest economically if they can be produced in low-cost processes.

Previously, due to the manufacturing costs, only the conductor layer of the OFET was patterned. The patterning can only be effected via a two-stage process ("Lithography method", cf. Applied Physics Letters 73(1), 1998, pp. 108-110 and Mol. Cryst. Liq. Cryst. 189, 1990, pp. 221-225) with initially full-area coating and subsequent patterning, which is furthermore material-specific. By "material specificity" is meant that the described process with the cited photochemical components only works on the conducting organic material polyaniline. A different conducting organic material, e.g. polypyrrole, cannot be patterned as a matter of course by this means.

The lack of patterning of the other layers, such as at least that of the semiconducting and insulating layers composed of functional polymers, leads to a marked lowering in performance of the OFETs obtained, but this is still dispensed with for reasons of cost. The patterned layer can be patterned using other known methods (such as e.g. printing) only in such a way that the length 1, which denotes the distance between source and drain electrode and therefore represents a measure for the performance density of the OFET, is at least 30 to 50 µm. The aim is to achieve lengths 1 of less than 10 µm, however, which means that at the present time, with the exception of the complex and expensive lithography method, no patterning method appears practicable.

SUMMARY OF THE INVENTION

The object of the invention is therefore to provide a low-cost method for patterning high-resolution OFETs that is suitable for mass production. It is further the object of the invention to create a more powerful, because comprising more patterned layers, as well as a more compact OFET which can be fabricated with a smaller distance 1.

The subject matter of the invention is an organic field-effect transistor (OFET) comprising at least the following layers on a substrate:
  an organic semiconductor layer between and over at least a source and at least a drain electrode which are made of a conducting organic material,
  an organic insulation layer over the semiconducting layer and
  an organic conductor layer where the conductor layer and at least one of the two other layers are patterned. Also the subject matter of the invention is a method for patterning an OFET by introducing at least one functional polymer into a negative mold by means of a doctor blade. Finally, the subject matter of the invention is an integrated circuit comprising at least one OFET which has at least one patterned conductor layer and one further patterned layer.

A negative mold is a term used to denote a patterned layer or a part of a patterned layer which contains recesses into which the functional polymer, which forms, for example, an electrode of an OFET or a semiconductor or an insulator layer, is introduced by means of a doctor blade.

The method comprises the following operating steps:
a) a possibly full-area mold layer, which does not have to be limited to the area that is to be patterned, is applied to a substrate or a lower layer. This mold layer is not the functional polymer (that is, semiconducting, conducting or insulating layer) but a different organic material which serves as a mold or template for the conducting organic electrode layer. This other organic material should have insulating properties.
b) the mold layer is provided with recesses which correspond to the patterns by means of imprinting (impressing of a stamp die with subsequent curing by exposure),
c) the functional polymer is then introduced by means of a doctor blade into these recesses in liquid form, as a solution and/or as a molten mass.

The negative mold of the pattern on the mold layer can be generated by the imprint method, which represents a mature technology in the field of electronic and microelectronic components, on the substrate or on a lower layer. The material of the negative mold may be a UV-curable resist which has recesses following imprinting and exposure.

Resists suitable for this are available commercially and the method of patterning them by imprinting is known in the literature. Generally, during the imprinting onto the uncured mold polymer, which is deposited as a layer on the substrate or a lower layer, a stamp is impressed in such a way that recesses are created in the same manner as the patterning is to take place. The layer provided with recesses is then cured either thermally or by irradiation, which results in the rigid mold layer into which the functional polymer can be introduced by means of a doctor blade.

The advantage of the doctor blade method is that the difficult process of patterning functional polymers is prepared by means of the established and proven imprint method. This means that a rich technical background is available as a reference source and extremely fine patterns can be achieved. Furthermore, the doctor blade method is not material-specific. To the contrary, the doctor blade method enables polyaniline, but also any other conducting organic material, such as e.g. polypyrrole, to be used for the production of electrodes. Similarly, it allows any other organic material, such as e.g. polythiophene as a semiconductor and/or polyvinylphenol as an insulator, to be applied by means of a doctor blade and therefore patterned, i.e. the entire OFET.

According to an embodiment of the method, the negative mold is removed upon completion of the curing of the functional polymer, thereby reducing any height difference between functional polymer and negative mold possibly caused by evaporation of the solvent or shrinkage.

Another approach to avoiding any height difference which may have arisen between negative mold and functional polymer is to repeat the doctor blade application process, which results in the volume of the negative mold simply being filled up further.

As a rule, the functional polymers can largely be left at their optimal consistency. Thus, for example, polyaniline as a conducting organic material possesses a certain viscosity at its optimal conductivity. If, for example, polyaniline is to be printed and not applied by doctor blade, its viscosity must be set to a value appropriate to the printing method. This usually means that the conductivity is impaired. For the doctor blade method, the viscosity margin is incomparably greater than for printing, with the result that no changes to the viscosity usually have to be made to the organic material.

Finally, an advantage of the doctor blade method is the capability to apply thick layers. Thus, for example, the conductivity of 1 µm-thick polymer electrodes is effectively higher than with a typically 0.2-µm layer thickness. An OFET with a layer thickness in the region of up to 1 µm, particularly in the range from 0.3 to 0.7 µm, is therefore advantageous.

The term "functional polymer" as used here denotes any organic, organometallic and/or inorganic material which is integrated as a functional component in the structure of an OFET and/or an integrated circuit composed of a plurality of OFETs. This includes, for example, the conducting component (e.g. polyaniline) which forms an electrode, the semiconducting component which forms the layer between the electrodes, and the insulating component. It should be explicitly pointed out that the description "functional polymer" accordingly also encompasses non-polymer components such as, for example, oligomeric compounds.

Briefly, the term "organic" as used here designates anything which is "based on organic material", the term "organic material" encompassing all types of organic, organometallic and/or inorganic synthetic materials generally referred to in English as e.g. "plastics". This includes all kinds of materials with the exception of the traditional semiconductors (germanium, silicon) and the typical metallic conductors. Any limitation in the dogmatic sense to organic material as carbon-containing material is accordingly not intended. Indeed, consideration is also given to the widespread use of e.g. silicons. Furthermore, the term is not intended to be subject to any limitation to polymer or oligomeric materials, but rather the use of "small molecules" is also entirely conceivable.

The term "lower layer" as used here refers to any layer of an OFET onto which a layer that is to be patterned is applied. The mold layer from the mold polymer joins up with the "lower layer" or the substrate. Here, the mold polymer is also not fixed by the designation "polymer" to a polymer aggregate state; rather, this substance may also be any practically usable plastic material for forming a negative mold.

BRIEF DESCRIPTION OF THE DRAWINGS

An embodiment of the method is explained in more detail in the following description with reference to schematic figures.

In FIG. 1.5. it can be seen how the functional polymer 8 fills out the recesses 12 of the mold layer 2 in the finished OFET.

Figure 1:
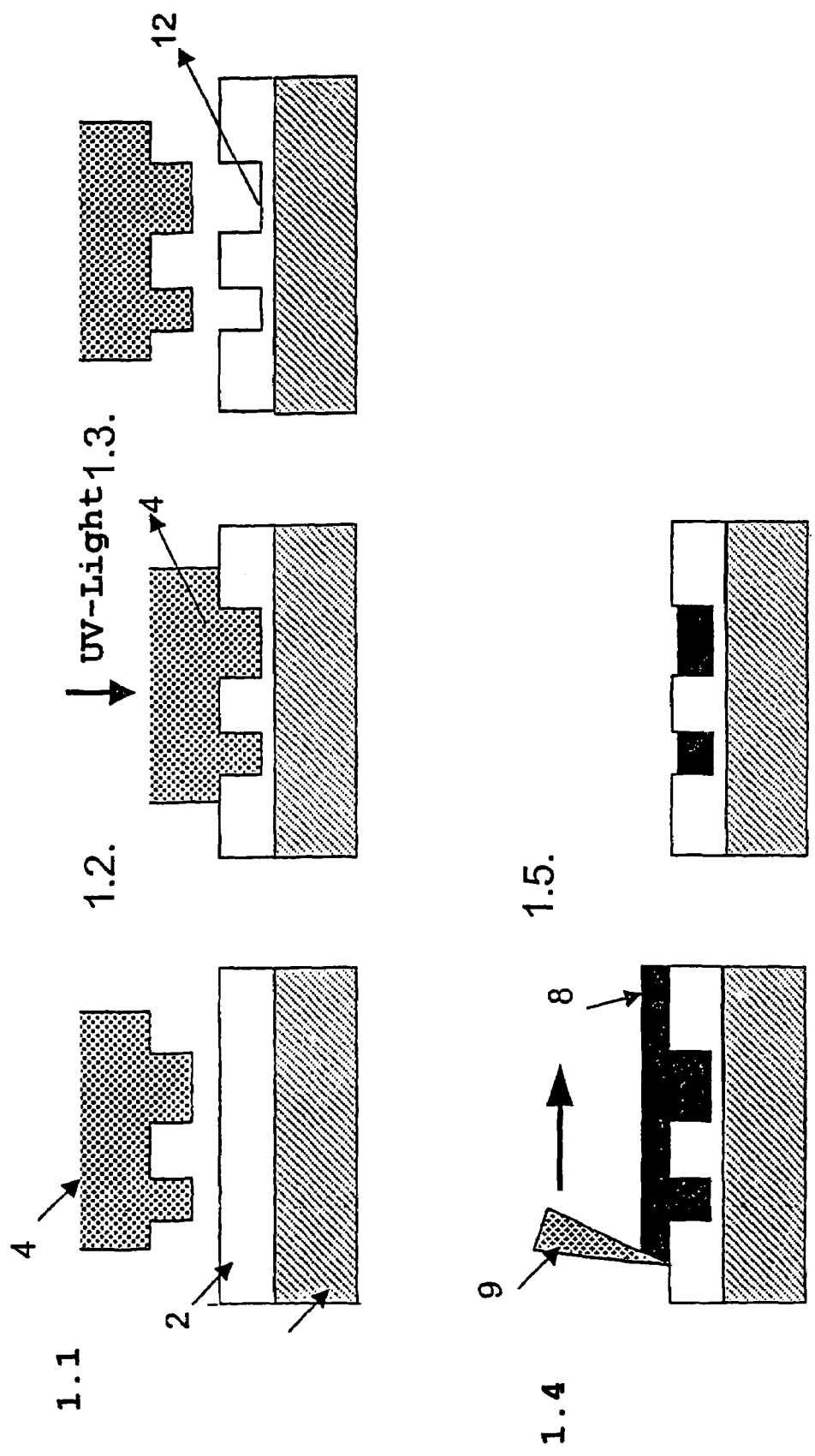
FIG. 1.1 shows the substrate or a lower layer 1 onto which the mold layer of the negative mold 2, for example composed of a mold polymer such as a UV-curable resist, is applied over the full area. The mold layer 2 is provided with recesses by means of a stamping die 4, such as is shown in FIG. 1.2. In other words, recesses are impressed into the mold layer 2 by means of the die 4, which can be composed, for example, of silicon dioxide ($SiO_2$). While the die 4 impresses the recesses 12, the mold layer 2 is irradiated with UV light, as a result of which the mold polymer 2 cures as the recesses 12 are permanently formed. This produces the recesses 12 in the mold layer 2, as shown in FIG. 1.3. On completion of the stamping, the die 4 is withdrawn from the mold layer 2. The functional polymer 8 (e.g. polyaniline) is then introduced into the recesses 12 by means of a doctor blade 9 (FIG. 1.4.).
Figure 2:
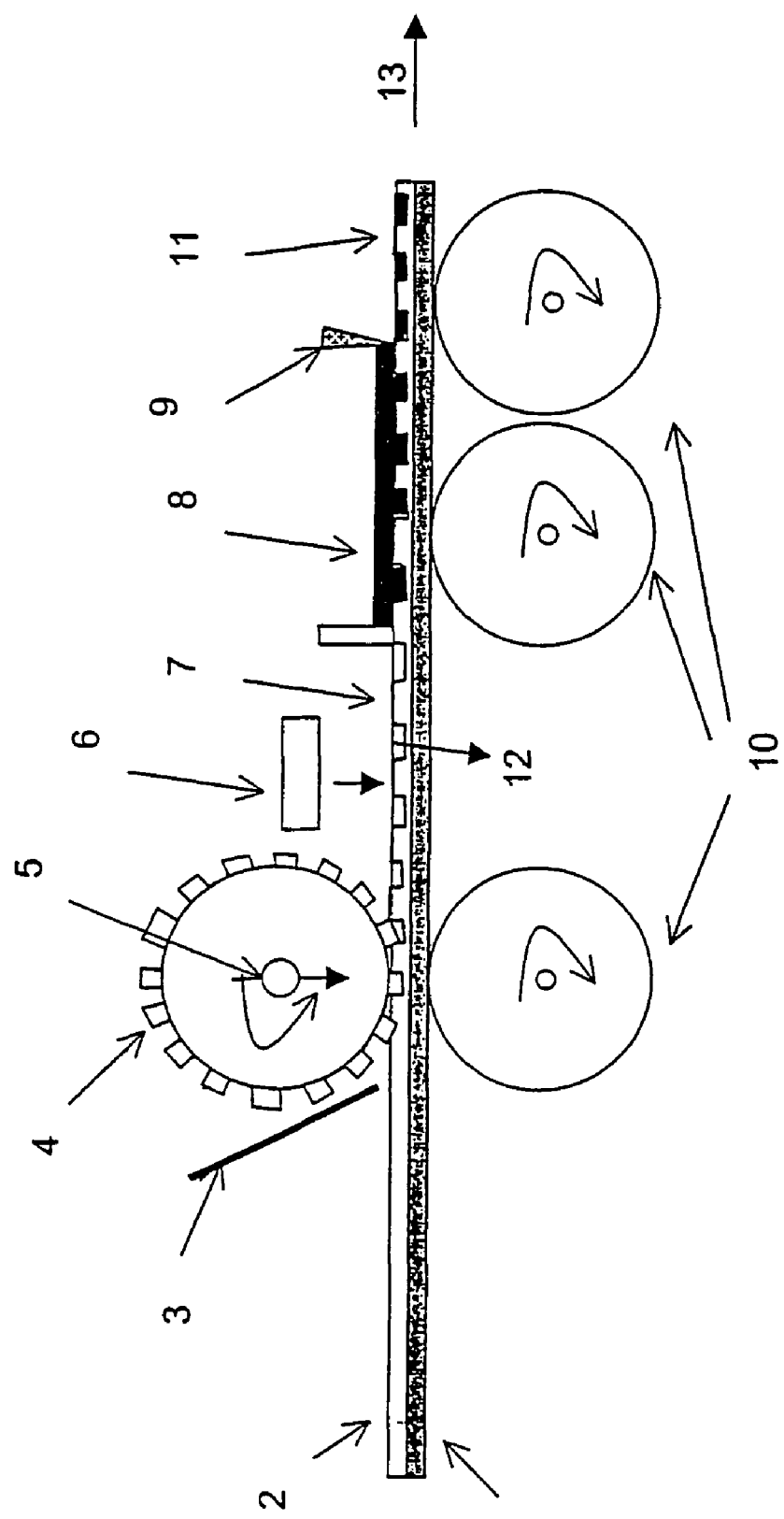
FIG. 2 shows a further embodiment of the method using a continuous process or continuous web printing. The belt consisting of substrate or lower layer 1 can be seen with the mold polymer 2, which may be a UV-curable but also a thermally curable resist. This belt is now subjected to different operating steps as it travels from left to right, as indicated by the arrow 13, along multiple pressure rollers 10. First, it passes the shadow plate 3, by means of which the not yet cured mold polymer 2 is protected against radiation. Then, recesses are impressed in the mold polymer 2 with the aid of the die roller 4 and are simultaneously hardened by means of the UV lamp 5 integrated in the die roller 4. The arrow emanating from 5 indicates the direction of the light cone which is emitted by 5. The belt provided with recesses 12 in the mold layer 2 then passes under a UV lamp or heater 6 for post-curing, with the result that a patterned resist 7 is produced. In the patterned resist 7 with the recesses 12, the functional polymer 8 is then introduced by means of the doctor blade 9, thereby producing the finished pattern 11.

The invention claimed is:

1. Method for forming an OFET comprising the following:
    a) depositing a mold layer for a negative mold on a substrate or a lower layer,
    b) imprinting recesses into the mold layer whereby the recesses correspond to the negatives of subsequent patterns of the OFET and
    c) then introducing a functional polymer into the recesses by a doctor blade.

2. Method according to claim 1, wherein the mold layer is removed upon completion of the patterning.

3. Method according to claim 1, wherein the functional polymer is introduced at least twice into the recesses of the mold layer by the doctor blade.

4. Method according to claim 1, comprising continuously performing the method of claim 1 with a continuously running belt.

5. Method according to claim 2, wherein the functional polymer is introduced at least twice into the recesses of the mold layer by the doctor blade.

6. Method according to claim 2, comprising continuously performing the method of claim 2 with a continuously running belt.

7. Method according to claim 3, comprising continuously performing the method of claim 3 with a continuously running belt.

* * * * *